US008294202B2

(12) United States Patent
Jangjian et al.

(10) Patent No.: US 8,294,202 B2
(45) Date of Patent: Oct. 23, 2012

(54) METAL GATE STRUCTURE OF A SEMICONDUCTOR DEVICE

(75) Inventors: Shiu-Ko Jangjian, Fengshan (TW); Szu-An Wu, Tainan (TW); Sheng-Wen Chen, Shinjuang (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 310 days.

(21) Appl. No.: 12/754,761

(22) Filed: Apr. 6, 2010

(65) Prior Publication Data

US 2011/0006354 A1 Jan. 13, 2011

Related U.S. Application Data (60) Provisional application No. 61/223,939, filed on Jul. 8, 2009.

(51) Int. Cl.
*H01L 21/02* (2006.01)

(52) U.S. Cl. ........ 257/327; 257/369; 257/410; 257/412; 257/E21.294; 257/E23.155; 257/E27.062; 257/E29.001; 257/E29.255; 438/589; 438/592; 438/635; 438/653

(58) Field of Classification Search .................. 257/327, 257/369, 410–412, E21.127, 294, 295, 584, 257/23.155, 27.062, 29.001, 158, 259; 438/585–592, 438/635, 653
See application file for complete search history.

(56) References Cited

U.S. PATENT DOCUMENTS

| 6,476,454 | B2 * | 11/2002 | Suguro | 257/410 |
|---|---|---|---|---|
| 6,607,958 | B2 * | 8/2003 | Suguro | 438/287 |
| 6,864,163 | B1 * | 3/2005 | Yu et al. | 438/585 |
| 6,867,128 | B2 * | 3/2005 | Deleonibus | 438/635 |
| 7,060,571 | B1 * | 6/2006 | Ngo et al. | 438/287 |
| 7,608,498 | B2 * | 10/2009 | Kobayashi et al. | 438/197 |
| 7,977,751 | B2 * | 7/2011 | Nagaoka et al. | 257/365 |
| 8,058,119 | B2 * | 11/2011 | Chung et al. | 438/199 |
| 8,058,125 | B1 * | 11/2011 | Lin et al. | 438/238 |
| 8,183,139 | B2 * | 5/2012 | Marxsen et al. | 438/586 |
| 2004/0159884 | A1 * | 8/2004 | Matsuoka | 257/327 |
| 2009/0020824 | A1 * | 1/2009 | Kadoshima | 257/369 |
| 2010/0052070 | A1 * | 3/2010 | Chung et al. | 257/369 |
| 2010/0127336 | A1 * | 5/2010 | Chambers et al. | 257/369 |
| 2011/0241130 | A1 * | 10/2011 | Chan et al. | 257/410 |
| 2011/0266637 | A1 * | 11/2011 | Lee et al. | 257/410 |

* cited by examiner

*Primary Examiner* — Michael Lebentritt
(74) *Attorney, Agent, or Firm* — Lowe Hauptman Ham & Berner, LLP (57) ABSTRACT

A semiconductor device structure, for improving the metal gate leakage within the semiconductor device. A structure for a metal gate electrode for a n-type Field Effect Transistor includes a capping layer; a first metal layer comprising Ti and Al over the capping layer; a metal oxide layer over the first metal layer; a barrier layer over the metal oxide layer; and a second metal layer over the barrier layer.

21 Claims, 7 Drawing Sheets

METAL GATE STRUCTURE OF A SEMICONDUCTOR DEVICE

CROSS-REFERENCE TO RELATED APPLICATIONS

The present application claims priority of U.S. provisional patent application Ser. No. 61/223,939, filed on Jul. 8, 2009, which is incorporated herein by reference in its entirety.

TECHNICAL FIELD

The disclosure relates to integrated circuit fabrication, and more particularly to a semiconductor device with a metal gate structure.

BACKGROUND

As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective thickness as would be provided by a typical gate oxide used in larger technology nodes.

Additionally, as technology nodes shrink, in some IC designs, there has been a desire to replace the typically poly-silicon gate electrode with a metal gate electrode to improve device performance with the decreased feature sizes. One process of forming the MG electrode is termed "gate last" process in which the final metal gate electrode is fabricated "last" which allows for reduced number of subsequent processes, including high temperature processing, that must be performed after formation of the gate.

Figure 1:
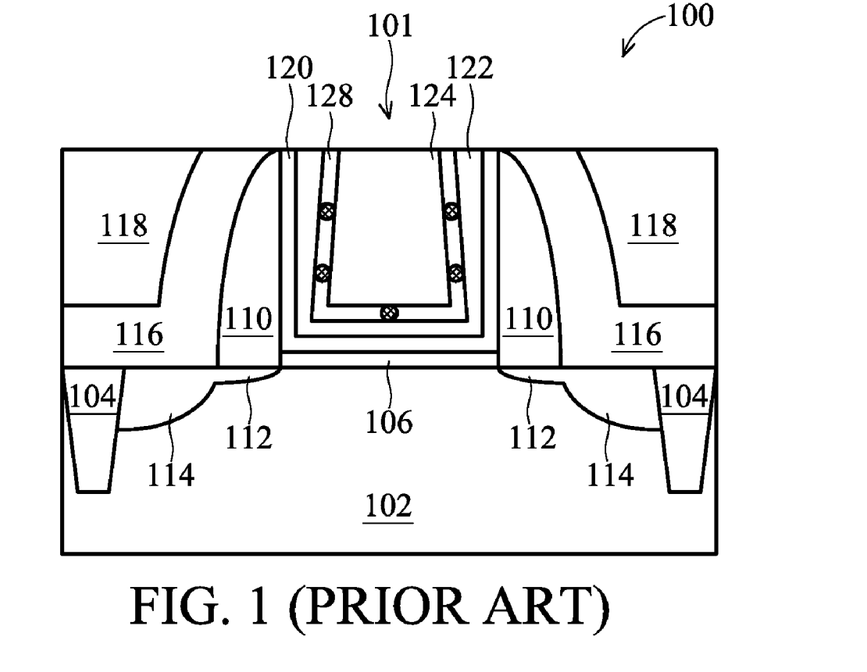
FIG. 1 shows a partial cross-sectional view of a conventional high-k/metal gate structure for a Field Effect Transistor having a leakage path.

FIG. 1 illustrates a partial cross-sectional view of a conventional high-k/metal gate structure for a Field Effect Transistor (FET) 100. The FET 100 can be formed over an active region of the substrate 102 adjacent to isolation structures 104. The FET 100 includes lightly doped regions 112 and source/drain regions 114 formed in a portion of the substrate 102, a gate structure 101 comprising a gate dielectric layer 106 and a metal gate electrode sequentially formed over the substrate 102, and spacers 110 respectively formed on both sidewalls of the gate structure 101. Additionally, a contact etch stop layer (CESL) 116 and an interlayer dielectric (ILD) layer 118 may also be formed over the substrate 102. The metal gate electrode comprises a metal capping layer 120, a first metal layer 122, a metal barrier layer 128, and a second metal layer 130 sequentially formed over the gate dielectric layer 106. The first metal layer 122 comprising Al and Ti may act as a work-function metal layer of an n-type FET. It has been observed that the Al may diffuse into the metal barrier layer 128, and interact with the metal barrier layer 128 to create inter-metallic compounds 124. The inter-metallic compounds 124 are problematic. For example, any inter-metallic compound 124 present in the metal gate electrode can become a gate leakage path of the gate structure 101 thereby increasing the likelihood of device instability and/or device failure.

Accordingly, what is needed is a metal gate electrode of a gate structure having no leakage path.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
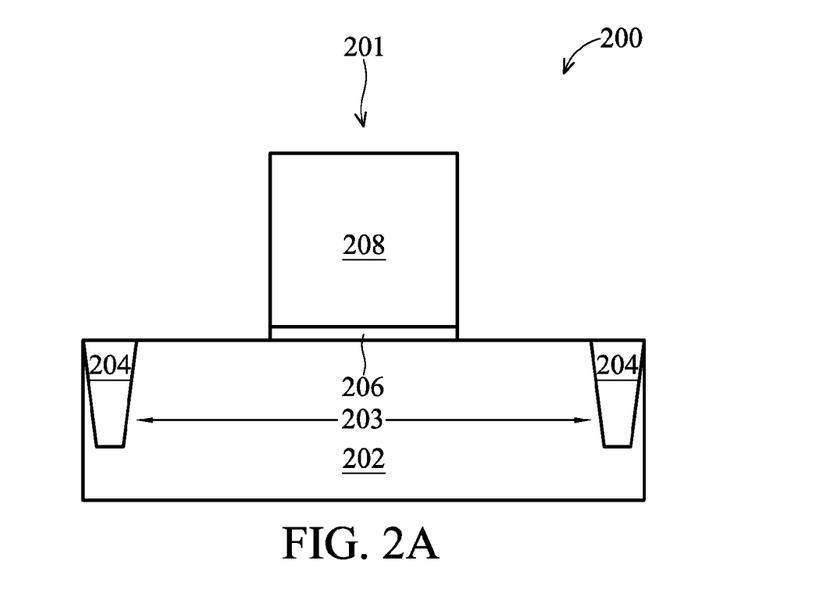
FIGS. 2A-I show schematic cross sections of a substrate processed according to an embodiment of a method for fabricating a metal gate structure according to an embodiment of the disclosure, showing various stages of fabrication.
Figure 2B:
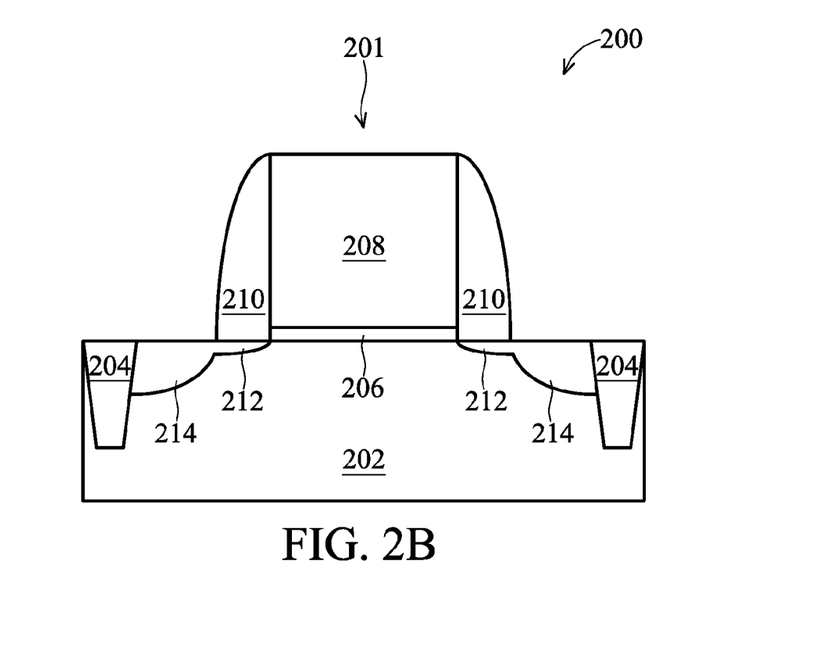
Figure 2C:
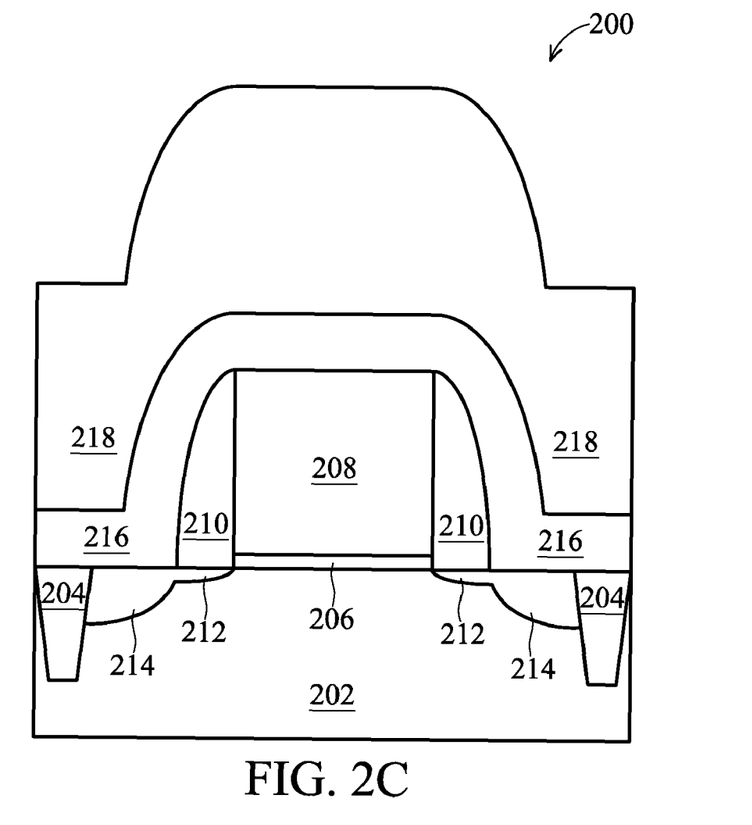
Figure 2D:
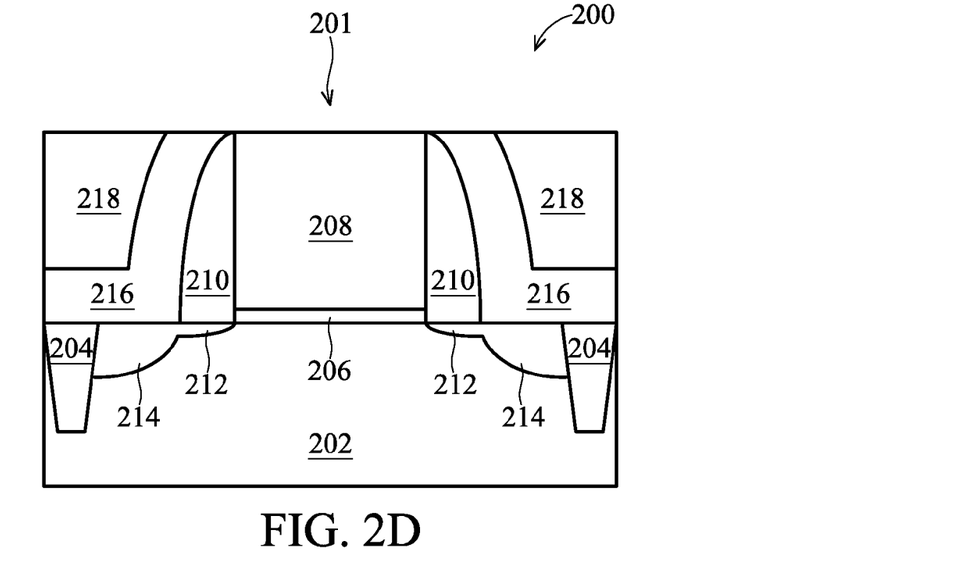
Figure 2E:
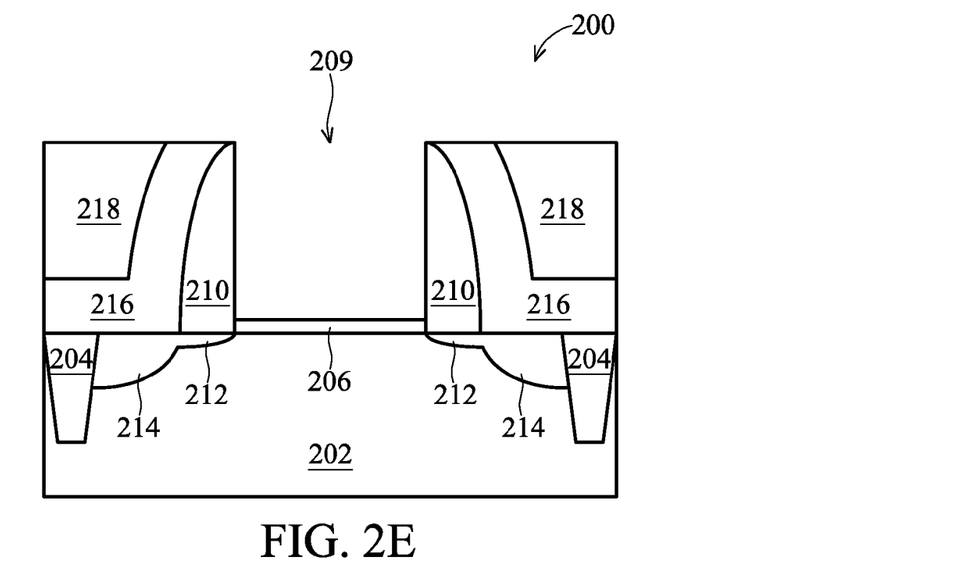
Figure 2F:
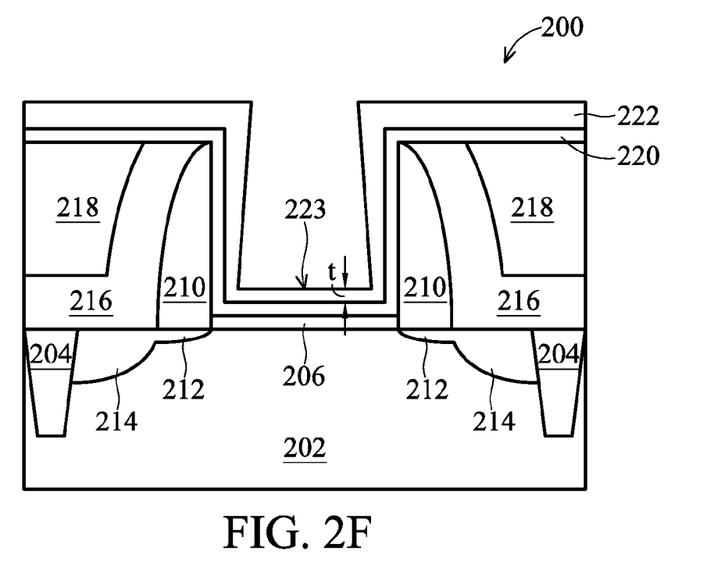
Figure 2G:
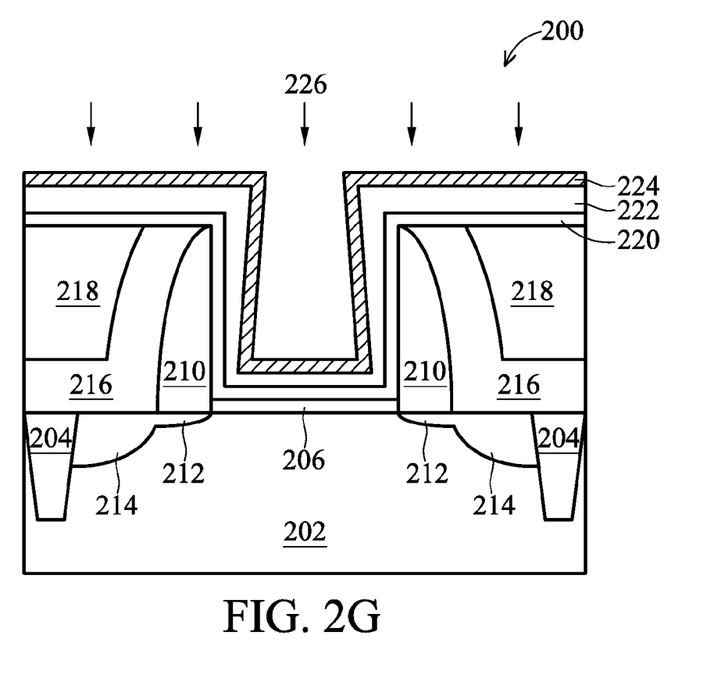
Figure 2H:
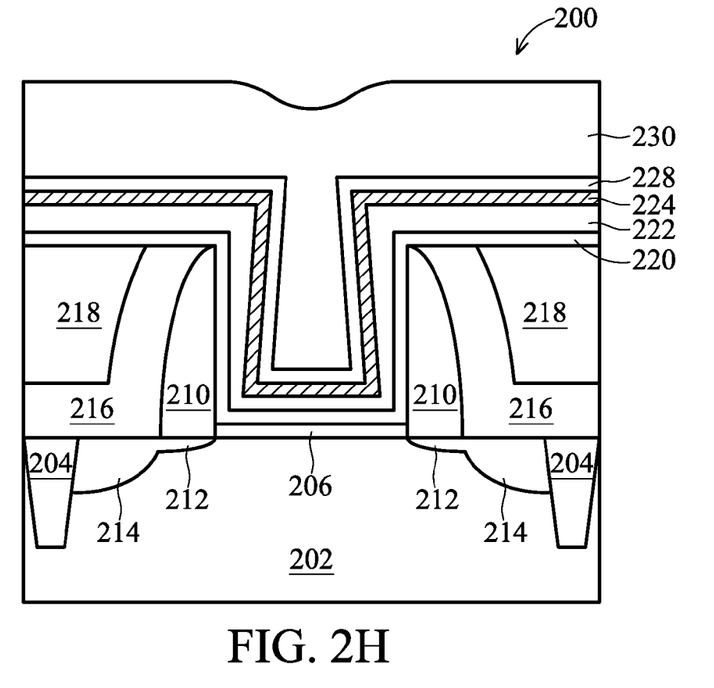
Figure 2I:
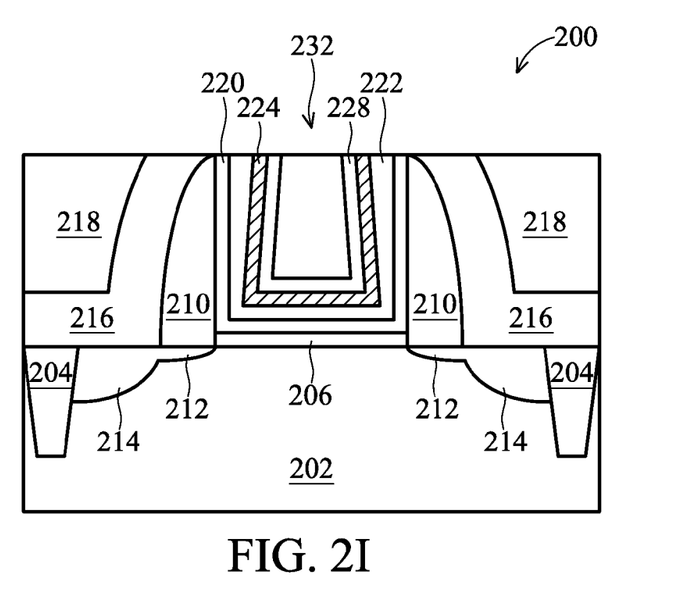
Figure 3:
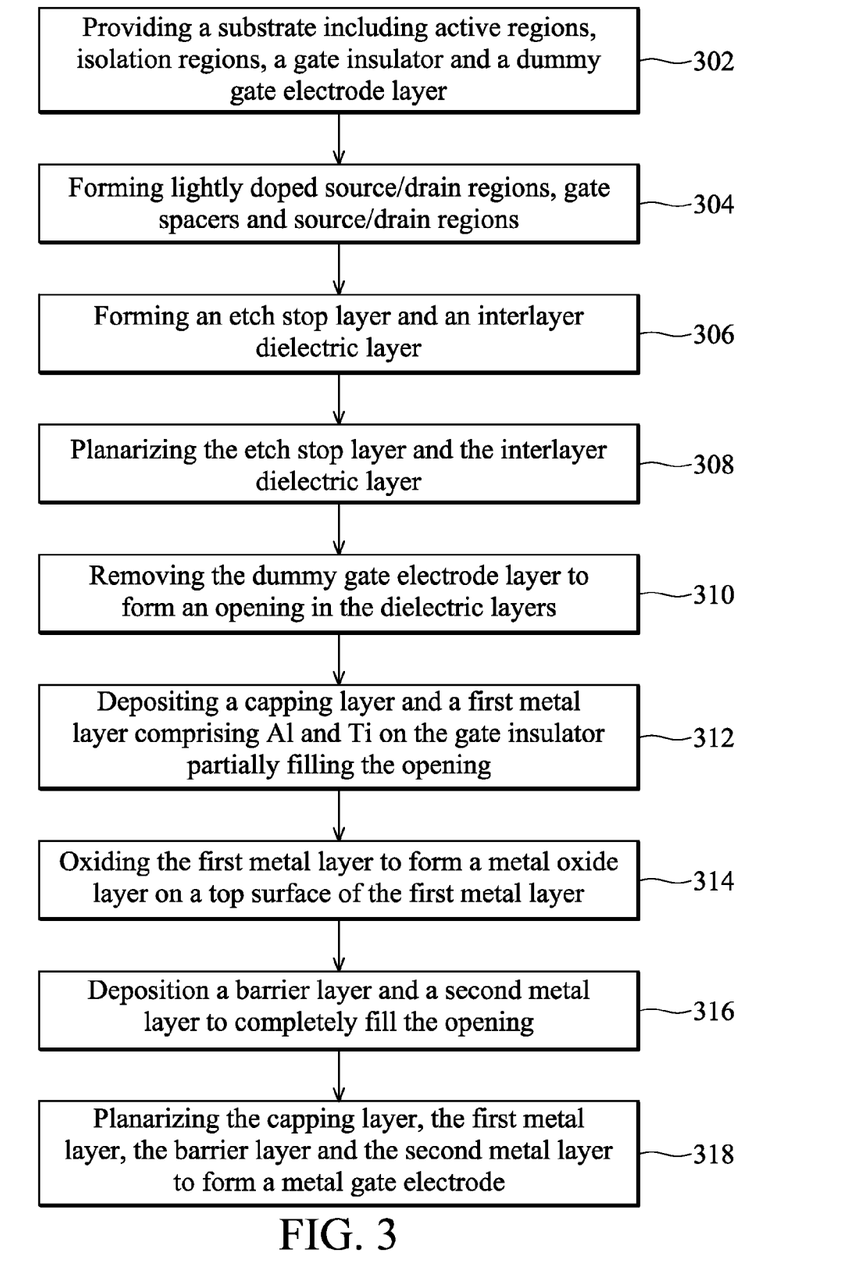
FIG. 3 is a flowchart of a method for fabricating a metal gate structure according to aspects of the disclosure.

With reference to FIGS. 2A through 3, a semiconductor device 200 and a method 300 are collectively described below. FIGS. 2A-I show schematic cross sections representing a metal gate structure at various stages of feature formation according to an embodiment of semiconductor device 200 manufacturing process. FIG. 3 is a flowchart of a method for fabricating a metal gate structure according to an embodiment of the disclosure. The semiconductor device 200 comprises an n-type Field Effect Transistor. Referring to FIGS. 2A and 3, the method 300 begins at step 302 wherein a substrate 202 including active regions 203 and isolation regions 204 is provided. In one embodiment, the substrate 202 includes a silicon substrate (e.g., wafer) in crystalline structure. Other examples of the substrate 202 may include other elementary semiconductors such as germanium and diamond. Alternatively, the substrate 202 may include a compound semiconductor such as, silicon carbide, gallium arsenide, indium arsenide, or indium phosphide. The substrate 202 may include various doping configurations depending on design requirements (e.g., p-type substrate or n-type substrate). Further, the substrate 202 may include an epitaxial layer (epi layer), may be strained for performance enhancement, and/or may include a silicon-on-insulator (SOI) structure.

The active regions 203 may include various doping configurations depending on design requirements as known in the art. In some embodiments, the active regions 203 may be doped with p-type or n-type dopants. For example, the active regions 203 may be doped with p-type dopants, such as boron or $BF_2$; n-type dopants, such as phosphorus or arsenic; and/or combinations thereof. The active regions 203 may act as regions configured for an N-type metal-oxide-semiconductor transistor device (referred to as an NMOS) and regions configured for a P-type metal-oxide-semiconductor transistor device (referred to as a PMOS).

The isolation regions 204 may be formed on the substrate 202 to isolate the various active regions 203. The isolation regions 204 may utilize isolation technology, such as local oxidation of silicon (LOCOS) or shallow trench isolation (STI), to define and electrically isolate the various active regions 203. In the present embodiment, the isolation region 204 includes a STI. The isolation regions 204 may comprise silicon oxide, silicon nitride, silicon oxynitride, fluoride-doped silicate glass (FSG), a low-K dielectric material, other suitable materials, and/or combinations thereof. The isolation regions 204, and in the present embodiment, the STI, may be formed by any suitable process. As one example, the formation of an STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 2A and 3, at step 302, a dummy gate structure 201 is formed over the substrate 202. In the present embodiment, the dummy gate structure 201 comprising a gate dielectric layer 206 and a dummy gate electrode layer 208. The dummy gate structure 201 may be formed using any suitable process, including the processes described herein. In one example, the gate dielectric layer 206 and dummy gate electrode layer 208 are sequentially deposited over the substrate 202. Then, a layer of photoresist is formed over the dummy gate structure 201 by a suitable process, such as spin-on coating, and patterned to form a patterned photoresist feature by a proper lithography patterning method. The patterned photoresist feature can then be transferred by a dry etching process to the underlying layers (i.e., the gate dielectric layer 206 and the dummy gate electrode layer 208) to form the dummy gate structure 201. The photoresist layer may be stripped thereafter. In another example, a hard mask layer is formed over the over the dummy gate structure 201; a patterned photoresist layer is formed on the hard mask layer; the pattern of the photoresist layer is transferred to the hard mask layer and then transferred to the dummy gate electrode layer 208 and the gate dielectric layer 206 to form the dummy gate structure 201. It is understood that the above examples do not limit the processing steps that may be utilized to form the dummy gate structure 201. It is further understood that the dummy gate structure 201 may comprise additional dielectric layers and/or conductive layers. For example, the dummy gate structure 201 may comprise hard mask layers, interfacial layers, capping layers, diffusion/barrier layers, other suitable layers, and/or combinations thereof.

In some embodiments, the gate dielectric layer 206 may comprise silicon oxide, silicon oxynitride, high-k dielectric layer or combination thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The gate dielectric layer 206 may further comprise an interfacial layer to reduce damages between the gate dielectric layer 206 and the substrate 202. The interfacial layer may comprise silicon oxide.

In some embodiments, the dummy gate electrode layer 208 may comprise a single layer or multilayer structure. In the present embodiment, the dummy gate layer 208 may comprise poly-silicon. Further, the dummy gate electrode layer 208 may be doped poly-silicon with the same or different doping.

Referring to FIGS. 2B and 3, at step 304, lightly doped source/drain (LDD) regions 212 may be formed in the substrate 202. The LDD regions 212 may be formed in the substrate 202 by one or more implantation processes, such as an ion implantation process. The doping species may depend on the type of device being fabricated, such as an NMOS or PMOS device. For example, the LDD regions 212 may be doped with p-type dopants, such as boron or $BF_2$; n-type dopants, such as phosphorus or arsenic; and/or combinations thereof. The LDD regions 212 may comprise various doping profiles. The LDD regions 212 may be aligned with an outer edge of the dummy gate structure 201 following the ion implantation process. In some embodiment, a sealing layer (not shown) may be formed on the sidewalls of the dummy gate structure 201. The sealing layer may provide protection to prevent contamination or damage to the dummy gate structure 201 comprising the gate dielectric layer 206 and the dummy gate electrode layer 208 during subsequent processing. Thus, the integrity of the dummy gate structure 201 may be maintained which may result in better device performance and reliability. The LDD regions 212 may be aligned with an outer edge of the sealing layer following the ion implantation process.

Still referring to FIGS. 2B and 3, at step 304, following formation of the LDD regions 212, gate spacers 210 on each side of the dummy gate structure 201 may be formed. The gate spacers 210 may be formed using any suitable process to any suitable thickness, including the processes described herein. The gate spacers 210 may comprise a dielectric material such as silicon nitride, silicon oxide, silicon carbide, silicon oxynitride, other suitable materials, and/or combinations thereof. The gate spacers 210 may comprise a multilayer structure.

Still referring to FIGS. 2B and 3, at step 304, the gate spacers 210 may be used to offset source/drain (S/D) regions 214 (also referred to as heavily doped source/drain regions). The S/D regions 214 may be formed in the substrate 202 by one or more implantation processes, such as an ion implantation process. The doping species may depend on the type of device being fabricated, such as an NMOS or PMOS device. For example, the S/D regions 214 may be doped with p-type dopants, such as boron or $BF_2$; n-type dopants, such as phosphorus or arsenic; and/or combinations thereof. The S/D regions 214 may comprise various doping profiles, and the S/D regions 214 may be aligned with an outer edge of the spacers 210 following the ion implantation process. The S/D regions 214 may further include raised S/D regions in some embodiments. Also, one or more contact features (e.g., silicide regions) may be formed on the S/D regions 214 by a salicidation (or self-aligned silicidation) process.

Referring to FIGS. 2C and 3, at step 306, an etch stop layer (ESL) 216 may be formed over the substrate 202, including over the dummy gate structure 201, by any suitable process, including the processes described herein. The ESL 216 may include silicon nitride, silicon oxynitride, and/or other suitable materials. In the present embodiment, the ESL 216 is a contact etch stop layer (CESL) comprising silicon nitride.

ESL 216 further comprises any suitable thickness. In the present embodiment, ESL 216 comprises a thickness of about 200 Å.

Still referring to FIGS. 2C and 3, at step 306, following formation of the ESL 216, an interlayer (or inter-level) dielectric (ILD) layer 218 may be formed over the ESL 216. The ILD layer 218 may comprise a dielectric material. The dielectric material may comprise silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD layer 218 may include a high density plasma (HDP) dielectric material (e.g., HDP oxide) and/or a high aspect ratio process (HARP) dielectric material (e.g., HARP oxide). The ILD layer 218 comprises any suitable thickness. In the present embodiment, ILD layer 218 comprises a thickness of about 4000 Å. It is understood that the ILD layer 218 may comprise one or more dielectric materials and/or one or more dielectric layers.

Subsequently, the ESL 216 and/or ILD layer 218 may be planarized by a chemical-mechanical-polishing (CMP) process until a top portion of the dummy gate structure 201 overlying the substrate 202 is exposed as illustrated in FIGS. 2D and 3, at step 308. The CMP process may have a high selectivity to provide a substantially planar surface for the dummy gate structure 201, gate spacers 210, ESL 216, and ILD layer 218. The CMP process may also have low dishing and/or metal erosion effect. In the present embodiment, the dummy gate electrode layer 208 may be surrounded with dielectric comprising the gate spacers 210, ESL 216, and ILD layer 218.

Referring to FIGS. 2E and 3, at step 310, after the CMP process, a gate replacement process is performed. The dummy gate electrode layer 208 may be removed from the dummy gate structure 201 surrounded with dielectric comprising the gate spacers 210, ESL 216, and ILD layer 218. The dummy gate electrode layer 208 may be removed to form an opening 209 in the dummy gate structure 201 by any suitable process, including the processes described herein. The dummy gate electrode layer 208 may be removed using a wet etch and/or a dry etch process. In an embodiment, the wet etch process for dummy poly-silicon gate electrode layer 208 includes exposure to a hydroxide containing solution (e.g., ammonium hydroxide), deionized water, and/or other suitable etchant solutions.

Referring to FIGS. 2F and 3, at step 312, subsequent to the dummy gate electrode layer 208 removal process, a capping layer 220 and a first metal layer 222 over the gate insulator 206 may be deposited to partially fill in the opening 209. The capping layer 220 comprising a material selected from a group of TiN, TaN and WN. The first metal layer 222 deposited may be any metal material suitable for forming a work function (WF) layer. In the present embodiment, the first metal layer 222 for a n-type Field-Effect Transistor comprises Al and Ti over the capping layer 220. Atomic ratio of the Al to Ti in the first metal layer 222 is from 1 to 3. The first metal layer 222 has an average thickness (t) ranging from 10 to 100 angstroms in the bottom of the opening 209. The first metal layer 222 comprises a top surface 223.

Referring to FIGS. 2G and 3, at step 314, after the first metal layer 222 deposition process, an oxidation process is used to oxidize the first metal layer 222 to form a metal oxide layer 224 having a desired thickness on the top surface of the first metal layer 222. The oxidation process of oxidizing the first metal layer 222 to form a metal oxide layer 224 comprises exposing the top surface of the metal layer to an oxygen-containing gas 226.

In one embodiment, the oxidation process of oxidizing the first metal layer 222 to form a metal oxide layer 224 comprises exposing the top surface of the first metal layer 222 to air. In one embodiment, the step of the exposing the top surface of the first metal layer 222 to air starts with introducing the structure of FIG. 2F into an air exposure of a cleanroom under duration of 2 hours to 10 hours. In a class 1 cleanroom, a typical temperature control is about 68° F. and a relative humidity setting may be in the range of 30% to 50%. The air exposure forms a metal oxide layer 224 which impede Al and Ti diffusion, avoid inter-metallic compound formation and thus reduce gate leakage. An atomic ratio of the Al to Ti in the metal oxide layer 224 is from 2 to 3. The metal oxide layer 224 has a thickness ranging from 10 to 40 angstroms.

In another embodiment, the oxidation process of oxidizing the first metal layer 222 to form a metal oxide layer 224 comprises exposing the top surface of the first metal layer 222 to a plasma treatment. The step of the exposing the top surface of the first metal layer 222 to the plasma treatment starts with introducing the structure of FIG. 2F into a sealed reaction chamber in which the oxidation process uses gas phase reactants. The gas phase reactants comprise a gas selected from the group of $O_2$, NO, N2O, or combination thereof. The plasma treatment is performed under a pressure within the range of between 1 and 50 Torr, an rf power of about 200 watts, a temperature within the range between 300 and 400 degrees ° C. and a duration of 10 to 100 seconds. The plasma treatment forms a metal oxide layer 224 which impede Al and Ti diffusion, avoid inter-metallic compound formation and thus reduce gate leakage. An atomic ratio of the Al to Ti in the metal oxide layer 224 is from 2 to 3. The metal oxide layer 224 has a thickness ranging from 10 to 40 angstroms.

Referring to FIGS. 2H and 3, at step 316, subsequent to the oxidation process of oxidizing the first metal layer 222 to form a metal oxide layer 224, a metal barrier layer 228 and a second metal layer 230 may be further deposited on the metal oxide layer 224 to completely fill the opening 209. The metal barrier layer 228 comprises a material selected from a group of TiN, TiCN, TaN, TaCN, WN and WCN. The second metal layer 230 may include aluminum (Al) or tungsten (W), or other suitable materials. In an embodiment, the second metal layer 230 may further include a Ti layer that functions as a wetting layer and an Al layer to fill in the remainder of the opening 209. The metal barrier layer 228, the second metal layer 230, and the wetting layer may be deposited using CVD, PVD, plating, or other suitable process Referring to FIGS. 2I and 3, at step 318, after filling the opening with metal layers, a CMP process may be performed to planarize the capping layer 220, the first metal layer 222, metal oxide layer 224, the metal barrier layer 228 and the second metal layer 230. The CMP process may remove a portion of the capping layer 220, the first metal layer 222, metal oxide layer 224, the metal barrier layer 228 and the second metal layer 230 until the top surface of the ILD layer 218 is reached. The CMP process provides the semiconductor device 200 with a metal gate electrode 232 of a gate structure having no leakage path. The metal gate electrode 232 thus comprises the capping layer 220, the first metal layer 222, metal oxide layer 224, the metal barrier layer 228 and the second metal layer 230. Then, subsequent processes, including interconnect processing, must be performed after forming the metal gate electrode of the gate structure to complete the semiconductor device 200 fabrication.

While the preferred embodiments have been described by way of example, it is to be understood that the scope of invention is not limited to the disclosed embodiments. To the contrary, it is intended to cover various modifications and similar arrangements (as would be apparent to those skilled in the art). The disclosure can be used to form or fabricate a metal gate electrode for n-type Field-Effect Transistor. In this way, a metal gate electrode for n-type Field-Effect Transistor is formed with a low leakage path.

What is claimed is:

1. A metal gate electrode for a n-type Field Effect Transistor comprising:
    a capping layer;
    a first metal layer comprising Ti and Al over the capping layer;
    a metal oxide layer over the first metal layer;
    a barrier layer over the metal oxide layer; and
    a second metal layer over the barrier layer.

2. The metal gate electrode of claim 1, wherein the metal oxide layer is formed by exposing a top surface of the first metal layer to an atmosphere comprising oxygen.

3. The metal gate electrode of claim 1, wherein the first metal layer has an average thickness ranging between 10 angstroms and 100 angstroms.

4. The metal gate electrode of claim 1, wherein an atomic ratio of the Al to Ti in the metal oxide layer is from 2 to 3.

5. The metal gate electrode of claim 1, wherein the metal oxide layer has a thickness ranging between 10 angstroms and 40 angstroms.

6. The metal gate electrode of claim 1, wherein the capping layer comprises a material selected from a group of TiN, TaN and WN.

7. The metal gate electrode of claim 1, wherein the metal barrier layer comprises a material selected from a group consisting of TiN, TiCN, TaN, TaCN, WN or WCN.

8. A n-type Field Effect Transistor comprising:
    a substrate comprising an active region;
    a gate insulator over the active region;
    a capping layer over the gate insulator;
    a first metal layer comprising Ti and Al over the capping layer;
    a metal oxide layer over the first metal layer;
    a barrier layer over the metal oxide layer;
    a second metal layer over the barrier layer; and
    source and drain regions in the active region on both sides of the gate insulator.

9. The n-type Field Effect Transistor of claim 8, wherein an atomic ratio of the Al to Ti in the first metal layer is from 1 to 3.

10. The n-type Field Effect Transistor of claim 8, wherein the metal oxide layer is formed by exposing a top surface of the first metal layer to an atmosphere comprising oxygen.

11. The n-type Field Effect Transistor of claim 8, wherein an atomic ratio of the Al to Ti in the metal oxide layer is from 2 to 3.

12. The n-type Field Effect Transistor of claim 8, wherein the metal oxide layer has a thickness ranging between 10 angstroms and 40 angstroms.

13. The n-type Field Effect Transistor of claim 8, wherein the capping layer comprises a material selected from a group of TiN, TaN and WN.

14. The n-type Field Effect Transistor of claim 8, wherein the metal barrier layer comprises a material selected from a group consisting of TiN, TiCN, TaN, TaCN, WN or WCN.

15. The n-type Field Effect Transistor of claim 8, wherein the gate insulator comprises a high-k dielectric layer.

16. The n-type Field Effect Transistor of claim 8, further comprising an interfacial layer between the gate insulator and the active region.

17. A method for fabricating a n-type Field Effect Transistor, the method comprising:
    forming a gate insulator over a substrate;
    forming an opening in a dielectric layer and over the gate insulator;
    depositing a first metal layer comprising Ti and Al on the gate insulator partially filling the opening;
    oxidizing the first metal layer to form a metal oxide layer on a top surface of the first metal layer; and
    depositing a second metal layer to completely fill the opening.

18. The method of claim 17, wherein the step of oxidizing the first metal layer to form a metal oxide layer comprises exposing the top surface of the first metal layer to oxygen-containing gas.

19. The method of claim 17, wherein the step of oxidizing the first metal layer to form a metal oxide layer comprises exposing the top surface of the first metal layer to air.

20. The method of claim 17, wherein the step of oxidizing the first metal layer to form a metal oxide layer comprises exposing the top surface of the first metal layer to a plasma treatment.

21. The method of claim 17, wherein the step of forming an opening in a dielectric layer over the gate insulator comprises
    depositing and patterning a dummy gate electrode layer on the gate insulator;
    surrounding the dummy gate electrode layer with dielectric; and
    removing the dummy gate electrode layer.

* * * * *